United States Patent
Fang et al.

(10) Patent No.: US 10,736,242 B2
(45) Date of Patent: Aug. 4, 2020

(54) LOAD CONTROLLER AND ELECTRIC VEHICLE HAVING LOAD CONTROLLER

(71) Applicant: BYD COMPANY LIMITED, Shenzhen, Guangdong (CN)

(72) Inventors: Linxia Fang, Shenzhen (CN); Yin Chen, Shenzhen (CN); Xiaohua Yang, Shenzhen (CN)

(73) Assignee: BYD COMPANY LIMITED, Shenzhen, Guangdong (CN)

( * ) Notice: Subject to any disclaimer, the term of this patent is extended or adjusted under 35 U.S.C. 154(b) by 0 days.

(21) Appl. No.: 16/462,134

(22) PCT Filed: Oct. 16, 2017

(86) PCT No.: PCT/CN2017/106319
§ 371 (c)(1),
(2) Date: May 17, 2019

(87) PCT Pub. No.: WO2018/090772
PCT Pub. Date: May 24, 2018

(65) Prior Publication Data
US 2019/0335627 A1 Oct. 31, 2019

(30) Foreign Application Priority Data
Nov. 18, 2016 (CN) .......................... 2016 1 1041780

(51) Int. Cl.
*H05K 7/20* (2006.01)
*H01L 23/473* (2006.01)
(Continued)

(52) U.S. Cl.
CPC ....... *H05K 7/20872* (2013.01); *H01L 23/473* (2013.01); *H01L 25/112* (2013.01); *H02M 7/003* (2013.01)

(58) Field of Classification Search
CPC .......... H05K 7/20254; H05K 7/20872; H05K 7/20924; H05K 7/20927; F28D 1/0333; F28D 1/0341
See application file for complete search history.

(56) References Cited

U.S. PATENT DOCUMENTS

| | | | |
|---|---|---|---|
| 2014/0092663 A1* | 4/2014 | Shimizu | H02M 7/003 363/141 |
| 2014/0313806 A1* | 10/2014 | Shinohara | H05K 7/20927 363/141 |

(Continued)

FOREIGN PATENT DOCUMENTS

| CN | 103427669 A | 12/2013 |
|---|---|---|
| CN | 103872935 A | 6/2014 |

(Continued)

OTHER PUBLICATIONS

English Translation of International Search Report from PCT/CN2017/106319 dated Jan. 17, 2018 (2 pages).

*Primary Examiner* — Mukundbhai G Patel
(74) *Attorney, Agent, or Firm* — Calfee, Halter & Griswold LLP

(57) ABSTRACT

A load controller includes a casing; a busbar module, the busbar module including a DC busbar and an AC busbar connected to a load; a capacitor connected to an external DC power supply, the capacitor being connected to the DC busbar; an IGBT power module, an input end of each IGBT being connected to the DC busbar, and an output end of each IGBT being connected to the AC busbar; a heat-dissipating module, the heat-dissipating module including multiple heat-dissipating fins, each IGBT in a same column of IGBTs being sandwiched between adjacent two heat-dissipating fins; a driving circuit board, the driving circuit board being electrically connected to each IGBT; and a control circuit board, the control circuit board being connected to the (Continued)

driving circuit board, where all of the busbar module, the IGBT power module, the heat-dissipating module, the driving circuit board and the control circuit board are disposed on the casing.

19 Claims, 10 Drawing Sheets

(51) Int. Cl.
*H01L 25/11* (2006.01)
*H02M 7/00* (2006.01)

(56) References Cited

U.S. PATENT DOCUMENTS

2014/0340845 A1 11/2014 Straznicky et al.
2015/0351264 A1* 12/2015 Linderman .......... H05K 7/1432
361/729

FOREIGN PATENT DOCUMENTS

| CN | 105490508 A | 4/2016 |
| CN | 205195620 U | 4/2016 |
| CN | 106026693 A | 10/2016 |
| JP | 2013066259 A | 4/2013 |
| JP | 2015204688 A | 11/2015 |

\* cited by examiner

US 10,736,242 B2

LOAD CONTROLLER AND ELECTRIC VEHICLE HAVING LOAD CONTROLLER

CROSS-REFERENCE TO RELATED APPLICATIONS

This application is the U.S. national phase entry of PCT Application No. PCT/CN2017/106319, filed Oct. 16, 2017, which is based on and claims priority to Chinese Patent Application No. 201611041780.X, filed on Nov. 18, 2016, which are incorporated herein by reference in their entireties.

FIELD

The present invention relates to the field of electric vehicles, and in particular, to a load controller and an electric vehicle having the load controller.

BACKGROUND

In the related art, in a load controller of an electric vehicle, a cooler and a power module (for example, an IGBT power module) are in single-sided contact with each other for cooling, and the cooling efficiency is low. Moreover, in a casing of the load controller, a busbar, the power module and the cooler are unreasonable in layout, large in space occupation and small in size, and there is room for improvement.

SUMMARY

An objective of the present invention is to at least resolve one of the technical problems in the related art to some extent. In view of this, according to a first aspect of the present invention, a load controller having a small size and high cooling efficiency is provided.

According to a second aspect of the present invention, an electric vehicle having the foregoing load controller is provided.

The load controller according to an embodiment of the first aspect of the present invention includes a casing; a busbar module, the busbar module including a DC busbar and an AC busbar, the AC busbar is configured to be connected to a load; a capacitor, the capacitor is configured to be connected to an external DC power supply, and the capacitor is connected to the DC busbar; an IGBT power module, the IGBT power module including at least one column of IGBTs, a column of IGBTs including multiple IGBTs, an input end of each IGBT is connected to the DC busbar, and an output end of each IGBT is connected to the AC busbar; and a heat-dissipating module, the heat-dissipating module including multiple heat-dissipating fins, and each IGBT in the same column of IGBTs is sandwiched between two adjacent heat-dissipating fins, where all of the busbar module, the IGBT power module and the heat-dissipating module are disposed on the casing, the busbar module is located below the IGBT power module, and the capacitor is located at a side of the IGBT power module and the busbar module.

The load controller according to the embodiment of the present invention adopts the IGBT power module to convert DC power into AC power. The load controller is small in size and light in weight. Moreover, both sides of each IGBT are provided with heat-dissipating fins, thereby realizing double-sided cooling and high cooling efficiency. The busbar module, the IGBT power module and the capacitor are properly arranged in the casing, and the structure is compact, so that the entire load controller is small in space occupation and light in weight.

The electric vehicle according to an embodiment of the second aspect of the present invention includes a power battery pack; a load, the load including a motor; and the load controller according to the first aspect, an AC busbar of the load controller being connected to the load, and a capacitor of the load controller being connected to the power battery pack.

The electric vehicle according to the embodiment of the present invention is provided with the foregoing load controller which is high in cooling efficiency, small in size and light in weight, thereby realizing connection between a power battery and a load. Moreover, the connection structure is simple and reliable, and the safety is high.

DETAILED DESCRIPTION

Embodiments of the present invention are described in detail below, and examples of the embodiments are shown in the accompanying drawings. The following embodiments described with reference to the accompanying drawings are exemplary, and are intended to describe the present invention and cannot be construed as a limitation to the present invention.

An electric vehicle 1000 according to an embodiment of the present invention will be described below with reference to FIG. 1. It will be appreciated that the electric vehicle 1000 of the present invention may be a pure electric vehicle or a hybrid vehicle that is hybrid-driven by electric power and other power.

Figure 1:
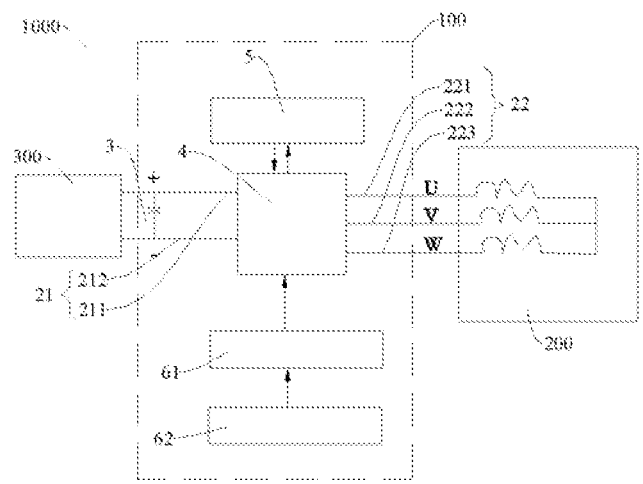
FIG. 1 is a working principle frame diagram of a load controller according to an embodiment of the present invention.

As shown in FIG. 1, the electric vehicle 1000 according to an embodiment of the present invention includes a power battery pack 300, a load and a load controller 100.

The power battery pack 300 supplies electric power to the entire vehicle. The load includes a motor 200, where the motor 200 is used for driving the electric vehicle 1000 to travel. The load controller 100 converts DC power of the power battery pack 300 into AC power to be supplied to the load. The load may also includes other electrical equipment such as a water pump, a fan or an air conditioner.

The load controller 100 according to an embodiment of the present invention will first be described with reference to FIG. 1 to FIG. 22. As shown in FIG. 1 to FIG. 22, the load controller 100 according to an embodiment of the present invention includes a casing 1, a busbar module 2, a capacitor 3, an IGBT power module 4, and a heat-dissipating module 5.

The casing 1 is a load bearing component of the load controller 100. The busbar module 2, the capacitor 3, the IGBT power module 4, the heat-dissipating module 5, a driving circuit board 61, and a control circuit board 62 are all disposed on the casing 1. In some embodiments, the busbar module 2, the capacitor 3, the IGBT power module 4, the heat-dissipating module 5, the driving circuit board 61, and a main body portion of the control circuit board 62 are all located in the casing 1, so that the casing 1 functions as a dustproof, anti-collision and sealing device for the foregoing components. The components should be connected to external components (for example, the motor 200 and the power battery pack 300), such as the capacitor 3, the busbar module 2 and the heat-dissipating module 5, may partially protrude out of the casing 1 so as to be connected to the external components (for example, the motor 200 and the power battery pack 300).

The busbar module 2 includes a DC busbar 21 and an AC busbar 22. The capacitor 3 is adapted to be connected to an external DC power supply (for example, the power battery pack 300), and the capacitor 3 is connected to the DC busbar 21. That is, the capacitor 3 is connected between the external DC power supply (for example, the power battery pack 300) and the DC busbar 21.

The IGBT power module 4 includes at least one column of IGBTs, and one column of IGBTs includes multiple IGBTs 41. For example, in some embodiments, each column of IGBTs includes at least one group of IGBTs, and each group of IGBTs includes three IGBTs 41. The IGBT refers to an insulated gate bipolar transistor.

An input end of each IGBT 41 is connected to the DC busbar 21, and an output end of each IGBT 41 is connected to the AC busbar 22.

It will be appreciated that the load controller 100 further includes a driving circuit board 61 and a control circuit board 62. The driving circuit board 61 is electrically connected to each IGBT 41, and the control circuit board 62 is connected to the driving circuit board 61.

The current of the external DC power supply sequentially passes through the capacitor 3, the DC busbar 21 and the input ends of the IGBTs 41, and then is input to the IGBT power module 4. The control circuit board 62 drives the driving circuit board 61 to operate, so that the IGBT power module 4 converts DC power into AC power, which is output to the AC busbar 22 through the output ends of the IGBTs 41 and finally output to the load through the AC busbar 22.

Figure 2:
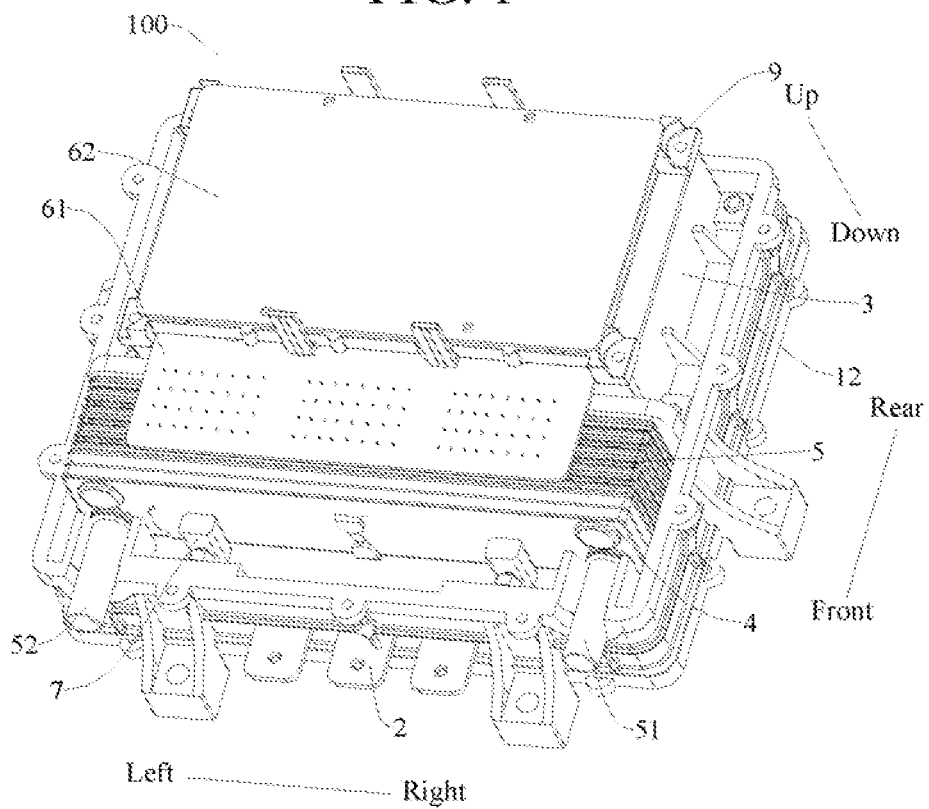
FIG. 2 is a schematic structural diagram of a load controller from a first perspective according to an embodiment of the present invention.
Figure 22:
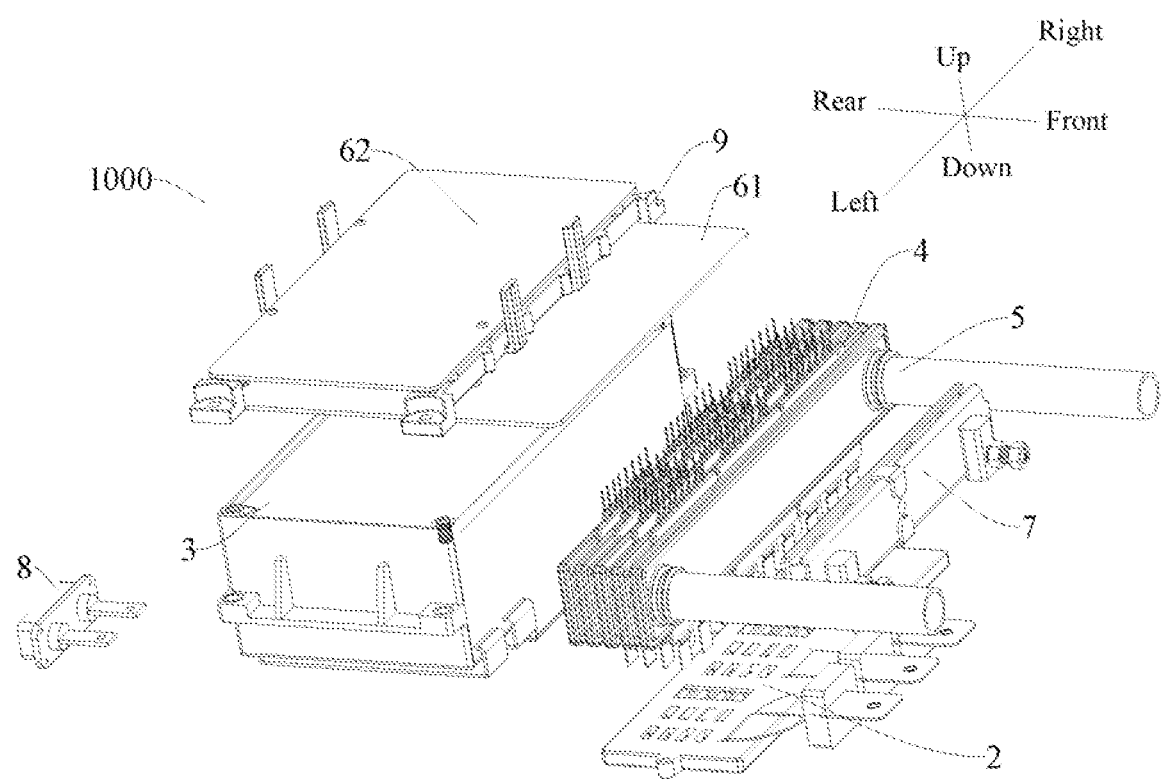
FIG. 22 is an exploded view of a load controller according to an embodiment of the present invention.

As shown in FIG. 2 and FIG. 22, the busbar module 2 is located below the IGBT power module 4. The capacitor 3 is located at a side of the IGBT power module 4 and the busbar module 2. That is, the capacitor 3 is located at one side, and the IGBT power module 4 and the busbar module 2 are located at the other side.

In an embodiment shown in FIG. 2, the busbar module 2, the IGBT power module 4 and the capacitor 3 are all located in the casing 1, the capacitor 3 is located at the rear, and the busbar module 2 and the IGBT power module 4 are located at the front.

The above arrangement facilitates the connection of the capacitor 3 to the busbar module 2, and facilitates the connection of the busbar module 2 to the IGBT power module 4. The connection path of the foregoing connection mode is short, thereby saving an arrangement space and making the load controller 100 compact in structure.

Specifically, the capacitor 3 includes a capacitor body 30, a positive input terminal 31 of the capacitor 3, a negative input terminal 32 of the capacitor 3, a positive output terminal 33 of the capacitor 3, and a negative output terminal 34 of the capacitor 3.

The DC busbar 21 includes a positive DC busbar 211 and a negative DC busbar 212. The AC busbar 22 includes a U-phase AC busbar 221, a V-phase AC busbar 222 and a W-phase AC busbar 223. The input end of each IGBT 41 includes an IGBT positive input terminal 411 and an IGBT negative input terminal 412, and the output ends of three IGBTs 41 in the same group of IGBTs are a U-phase output terminal 413, a V-phase output terminal 414 and a W-phase output terminal 415, respectively. That is, the output end of one of the IGBTs 41 in the same group of IGBTs is the U-phase output terminal 413, the output end of one of the remaining two IGBTs 41 in the same group of IGBTs is the V-phase output terminal 414, and the output end of the other one of the remaining two IGBTs 41 in the same group of IGBTs is the W-phase output terminal 415. Each IGBT 41 includes a power terminal 416, and each IGBT 41 is electrically connected to the driving circuit board 61 through the power terminal 416.

Positive and negative poles of the external DC power supply are respectively input to the capacitor body 30 through the positive input terminal 31 of the capacitor 3 and the negative input terminal 32 of the capacitor 3. After the capacitor body 30 performs charge storage, voltage regulation and filtration, it is output from the positive output terminal 33 of the capacitor 3 to the positive DC busbar 211, and is output from the negative output terminal 34 of the capacitor 3 to the negative DC busbar 212. The positive DC busbar 211 is connected to the IGBT positive input terminal 411, and the negative DC busbar 212 is connected to the IGBT negative input terminal 412 to input DC power to the IGBT power module 4. The control circuit board 62 drives the driving circuit board 61 to operate, so that the IGBT power module 4 converts the DC power into AC power, which is output to the U-phase AC busbar 221 through the U-phase output terminal 413, to the V-phase AC busbar 222 through the V-phase output terminal 414 and to the W-phase AC busbar 223 through the W-phase output terminal 415, and is finally output to the load through the output ends of the U-phase AC busbar 221, the V-phase AC busbar 222 and the W-phase AC busbar 223.

The heat-dissipating module 5 includes multiple heat-dissipating fins 53, and each IGBT 41 in the same column of IGBTs is sandwiched between adjacent two heat-dissipating fins 53. Therefore, both sides of each IGBT 41 may be in contact with the heat-dissipating fins 53 to realize double-sided cooling.

In a specific embodiment of the present invention, the IGBT power module 4 includes four columns of IGBTs, each column of IGBTs including a group of IGBTs, each group of IGBTs including three IGBTs 41. There are five heat-dissipating fins, and any one of the IGBTs 41 in each column of IGBTs is sandwiched between the adjacent two heat-dissipating fins 53.

It will be appreciated that the IGBT power module 4 in the load controller 100 has the largest cooling requirement. The load controller 100 according to an embodiment of the present invention adopts the IGBT power module 4 to convert DC power into AC power. The load controller is small in size and light in weight. Moreover, each IGBT 41 in the same group of IGBTs is sandwiched between the two adjacent heat-dissipating fins 53 of the heat-dissipating module 5, so that both sides of each IGBT 41 may be in contact with the heat-dissipating fins 53. The cooling area is large, and the cooling effect is good. Due to the small size of the IGBT power module 4, the entire load controller 100 is small in space occupation and light in weight. In addition, in the load controller 100 according to an embodiment of the present invention, the position of the busbar module 2, the capacitor 3, the heat-dissipating module 5, and the IGBT power module 4 is properly arranged on the basis of realizing double-sided cooling of each IGBT 41, so that the load controller 100 is more compact in structure, the space is fully utilized, and the size is further reduced.

An electric vehicle 1000 according to an embodiment of the present invention includes a power battery pack 300, a load and load controller 100. An AC busbar 22 of the load controller 100 is connected to the load, and a capacitor 3 of the load controller 100 is connected to the power battery pack 300. By providing the foregoing load controller 100, the power battery pack 300 is connected to the load, and DC power of the power battery pack 300 is converted into AC power to be supplied to the load, so as to drive the load to operate. Moreover, the load controller 100 is high in cooling efficiency, small in size and light in weight. By providing the foregoing load controller 100, the electrical connection structure of the entire vehicle is simple and reliable, and the safety is high.

The load controller 100 according to an embodiment of the present invention will be described in detail below with reference to FIG. 1 to FIG. 21. As shown in FIG. 1 to FIG. 21, the load controller 100 according to an embodiment of the present invention includes a casing 1, a busbar module 2, a capacitor 3, an IGBT power module 4, a heat-dissipating module 5, a driving circuit board 61, and a control circuit board 62.

The busbar module 2, the capacitor 3, the IGBT power module 4, the heat-dissipating module 5, the driving circuit board 61, and the control circuit board 62 are all disposed on the casing 1. The busbar module 2 includes a DC busbar 21 and an AC busbar 22. The capacitor 3 is connected between an external DC power supply and the DC busbar 21. DC power enters the IGBT power module 4 through the DC busbar 21. The control circuit board 62 controls the driving circuit board 61 to drive the IGBT power module 4 to convert the DC power into AC power. The AC power output by the IGBT power module 4 is output to a load through the AC busbar 22.

Some specific embodiments of the heat-dissipating module 5 will be described in detail below with reference to FIG. 2, FIG. 16 and FIG. 17. The heat-dissipating module 5 includes multiple heat-dissipating fins 53, each IGBT 41 in the same column of IGBTs being sandwiched between two adjacent heat-dissipating fins 53. Alternatively, each heat-dissipating fin 53 includes two sub-fins disposed oppositely, the two sub-fins being connected to define a space for accommodating a heat exchange medium. Preferably, the two sub-fins are welded to be connected together.

The heat-dissipating module 5 comprises a main water inlet pipe 51 and a main water outlet pipe 52. A heat exchange medium enters the heat-dissipating module 5 from the main water inlet pipe 51, exchanges heat with the IGBT 41 and then flows out of the heat-dissipating module 5 through the main water outlet pipe 52, thereby realizing cooling of the IGBT 41.

Figure 16:
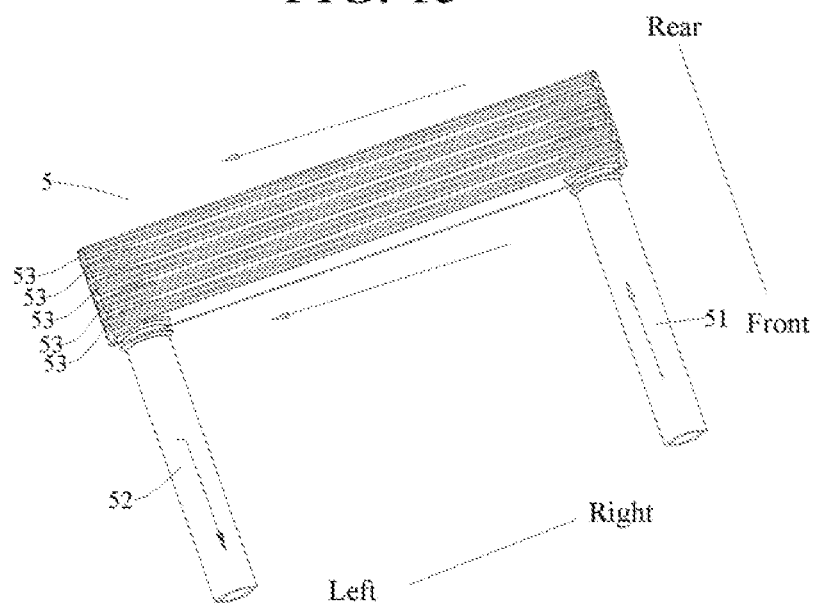
FIG. 16 is a schematic structural diagram of a heat-dissipating module according to one embodiment in embodiments of the present invention.

In an embodiment shown in FIG. 16, each heat-dissipating fin 53 comprises a cooling water channel, the main water inlet pipe 51 communicates with an inlet of each cooling water channel, and the main water outlet pipe 52 communicates with an outlet of each cooling water channel. That is, multiple cooling water channels are connected in parallel, a heat exchange medium entering from the main water inlet pipe 51 enters the corresponding cooling water channel from the inlet of each cooling water channel, flows out of the corresponding cooling water channel from the outlet of each cooling water channel, converges into the main water outlet pipe 52, and flows out of the heat-dissipating module 5 through the main water outlet pipe 52. The heat-dissipating fin 53 of the heat-dissipating module 5 comprises a simple structure, the flow path of the heat exchange medium is simple, and the implementation is easy.

Figure 17:
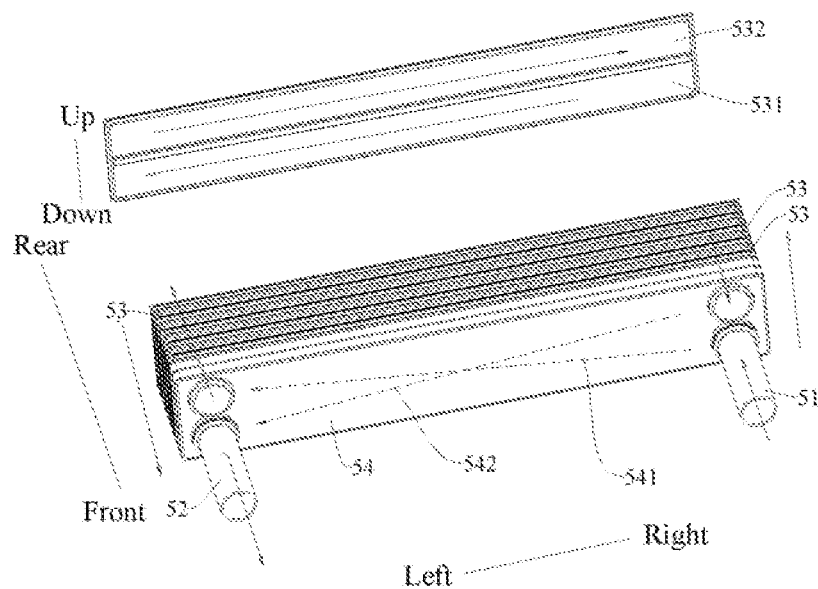
FIG. 17 is a schematic exploded structural diagram of a heat-dissipating module according to another embodiment in embodiments of the present invention.

In another embodiment shown in FIG. 17, the heat-dissipating module 5 includes a first flow deflecting channel 541, a second flow deflecting channel 542 and multiple heat-dissipating fins 53. Each heat-dissipating fin 53 comprises a first water channel 531 and a second water channel 532 separated from each other. The main water inlet pipe 51 communicates with an inlet of each first water channel 531. The main water inlet pipe 51 communicates with an inlet of each second water channel 532 through the first flow deflecting channel 541. The main water outlet pipe 52 communicates with an outlet of each first water channel 531. The main water outlet pipe 52 communicates with an outlet of each second water channel 532 through the second flow deflecting channel 542.

That is to say, a heat exchange medium entering from the main water inlet pipe 51 is divided into two paths. One path enters the corresponding first water channel 531 from the inlet of each first water channel 531, flows out of the corresponding first water channel 531 from the outlet of each first water channel 531, converges into the main water outlet pipe 52, and flows out of the heat-dissipating module 5 through the main water outlet pipe 52. The other path enters the corresponding second water channel 532 from the inlet of each second water channel 532 through the first flow deflecting channel 541, flows out from the outlet of each second water channel 532, converges into the main water outlet pipe 52 through the second flow deflecting channel 542, and flows out of the heat-dissipating module 5 through the main water outlet pipe 52. In the heat-dissipating module 5, the heat-dissipating fin 53 is provided with separate water channels, so that the flow path of the heat exchange medium is long, the cooling effect is better, and cooling is more uniform.

Alternatively, the first water channel 531 is parallel to the second water channel 532, whereby the structure of the heat-dissipating fin 53 is simpler. In some embodiments, the multiple heat-dissipating fins 53 are sequentially disposed in a front-rear direction, and the first water channel 531 and the second water channel 532 are spaced apart from each other in the front-rear direction. That is, each IGBT 41 in the same column of IGBTs is sandwiched between the first water channel 531 of one of adjacent two heat-dissipating fins 53 and the second water channel 532 of the other one of the adjacent two heat-dissipating fins 53.

In some other embodiments, the multiple heat-dissipating fins 53 are sequentially disposed in a front-rear direction, and the first water channel 531 and the second water channel 532 are located in the same plane. That is, the first water channel 531 and the second water channel 532 are spaced apart from each other in an up-down direction, and each IGBT 41 in the same column of IGBTs is sandwiched between the first water channels 531 of adjacent two heat-dissipating fins 53 and sandwiched between the second water channels 532 of the adjacent two heat-dissipating fins 53.

Preferably, the flow direction of the heat exchange medium in the first water channel 531 is opposite to the flow direction of the heat exchange medium in the second water channel 532, such that the heat exchange medium in the first water channel 531 sequentially exchanges heat with each IGBT 41 in the same column of IGBTs, and the heat exchange medium in the second water channel 532 sequentially exchanges heat with each IGBT 41 in the same column of IGBTs. The flow directions of the heat exchange medium in the two water channels are opposite, thereby making cooling of each IGBT 41 more uniform.

Therefore, the heat-dissipating module 5 performs two-way double-sided cooling for each IGBT 41, and the cooling effect is better.

It will be appreciated that multiple IGBTs 41 in the same column of IGBTs are sequentially arranged from left to right. As the heat exchange medium in the first water channel 531 flows from left to right, the temperature of the heat exchange medium in the first water channel 531 gradually rises, where the temperature of a portion of the right IGBT 41 exchanging heat with the first water channel 531 is higher than the temperature of a portion of the left IGBT 41 exchanging heat with the first water channel 531. As the heat exchange medium in the second water channel 532 flows from right to left, the temperature of the heat exchange medium in the second water channel 532 gradually rises, where the temperature of a portion of the right IGBT 41 exchanging heat with the second water channel 532 is lower than the temperature of a portion of the left IGBT 41 exchanging heat with the second water channel 532. Therefore, for each IGBT 41, each IGBT 41 is more uniformly cooled by the cooling of a two-way water channel, and the temperature difference between the multiple IGBTs 41 is smaller.

In the embodiment where the first water channel 531 and the second water channel 532 are spaced apart from each other in the front-rear direction and the first water channel 531 is located at the rear side of the second water channel 532, the portion of the right IGBT 41 exchanging heat with the first water channel 531 is a front surface of the right IGBT 41, the portion of the left IGBT 41 exchanging heat with the first water channel 531 is a front surface of the left IGBT 41, the portion of the right IGBT 41 exchanging heat with the second water channel 532 is a rear surface of the right IGBT 41, and the portion of the left IGBT 41 exchanging heat with the second water channel 532 is a rear surface of the left IGBT 41.

As shown in FIG. 17, in the embodiment where the first water channel 531 and the second water channel 532 are spaced apart from each other in the up-down direction and the first water channel 531 is located below the second water channel 532, the portions of the right IGBT 41 exchanging heat with the first water channel 531 are the lower parts of a front surface and a rear surface of the right IGBT 41, the portions of the left IGBT 41 exchanging heat with the first water channel 531 are the lower parts of a front surface and a rear surface of the left IGBT 41, the portions of the right IGBT 41 exchanging heat with the second water channel 532 are the upper parts of a front surface and a rear surface of the right IGBT 41, and the portions of the left IGBT 41 exchanging heat with the second water channel 532 are the upper parts of a front surface and a rear surface of the left IGBT 41.

As shown in FIG. 17, the load controller 100 further includes a flow deflector 54. Both the first flow deflecting channel 541 and the second flow deflecting channel 542 are disposed in the flow deflector 54, and the flow deflector 54 is disposed at a side (front side in FIG. 17) of the outermost heat-dissipating fin 53 among the multiple heat-dissipating fins 53. In this way, the design difficulty of the first flow deflecting channel 541 and the second flow deflecting channel 542 can be reduced, and the first flow deflecting channel 541 and the second flow deflecting channel 542 have a short length and a small occupied space, so that the heat-dissipating module 5 is simpler in structure and easier to arrange in the casing 1.

Further, the main water inlet pipe 51 and the main water outlet pipe 52 may be disposed at the lower part of the heat-dissipating module 5 and located at the same side of the heat-dissipating module 5. Therefore, the heat-dissipating module 5 comprises a simple structure and is easy to manufacture, and the flow path of the heat exchange medium is easy to arrange and clear in routing. In an embodiment shown in FIG. 17, the first flow deflecting channel 541 and the second flow deflecting channel 542 are inclined channels.

Some specific embodiments of the busbar module 2 will be described in detail below with reference to FIG. 7 to FIG.

15. The busbar module 2 according to an embodiment of the present invention includes a DC busbar 21 and an AC busbar 22, and the DC busbar 21 and the AC busbar 22 are injection-molded into an integrated structure. The integrated design makes the DC busbar 21 and the AC busbar 22 modular, thereby facilitating arrangement in the casing 1. For the load controller 100, the modular design facilitates the uniform arrangement of the components of the load controller 100, the assembly is simple, the structure of the load controller 100 can be more compact, the arrangement space is saved, and the circuit routing is clear.

Figure 7:
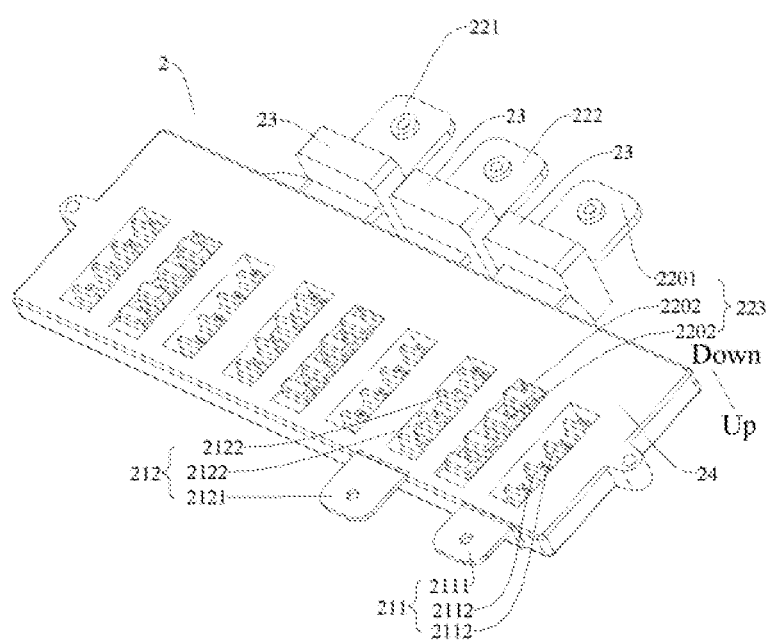
FIG. 7 is a schematic structural diagram of a busbar module according to an embodiment of the present invention.
Figure 12:
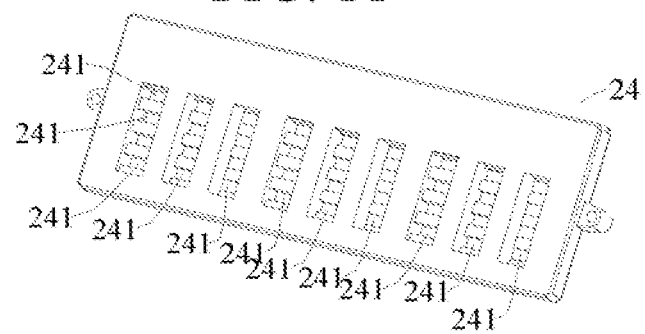
FIG. 12 is a schematic structural diagram of a plastic package according to an embodiment of the present invention.
Figure 13:
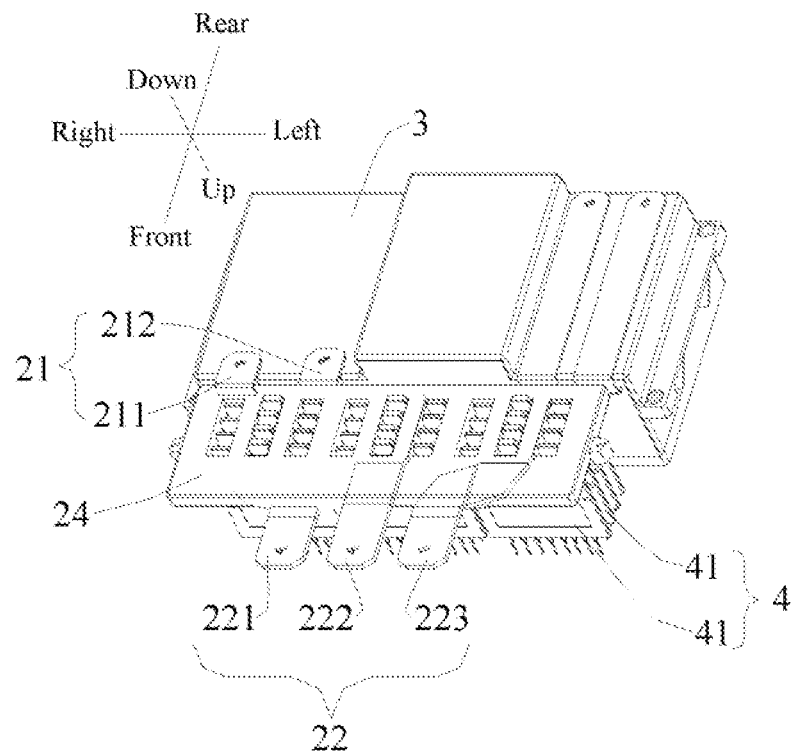
FIG. 13 is a schematic assembly diagram of a busbar module, a capacitor and an IGBT power module from a first perspective according to an embodiment of the present invention.
Figure 14:
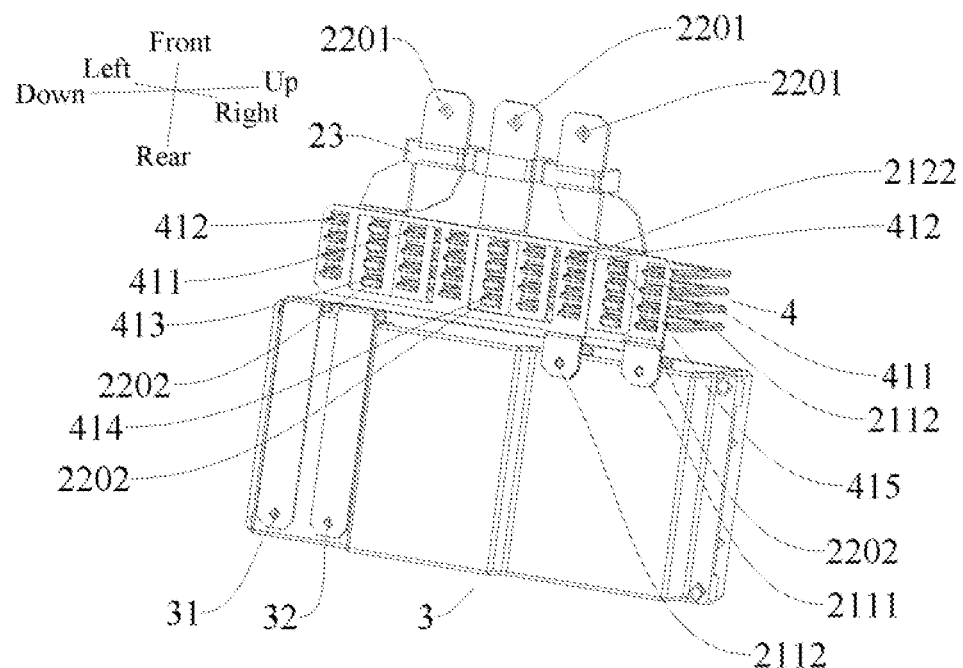
FIG. 14 is a schematic assembly diagram of a busbar module, a capacitor and an IGBT power module from a second perspective according to an embodiment of the present invention.
Figure 15:
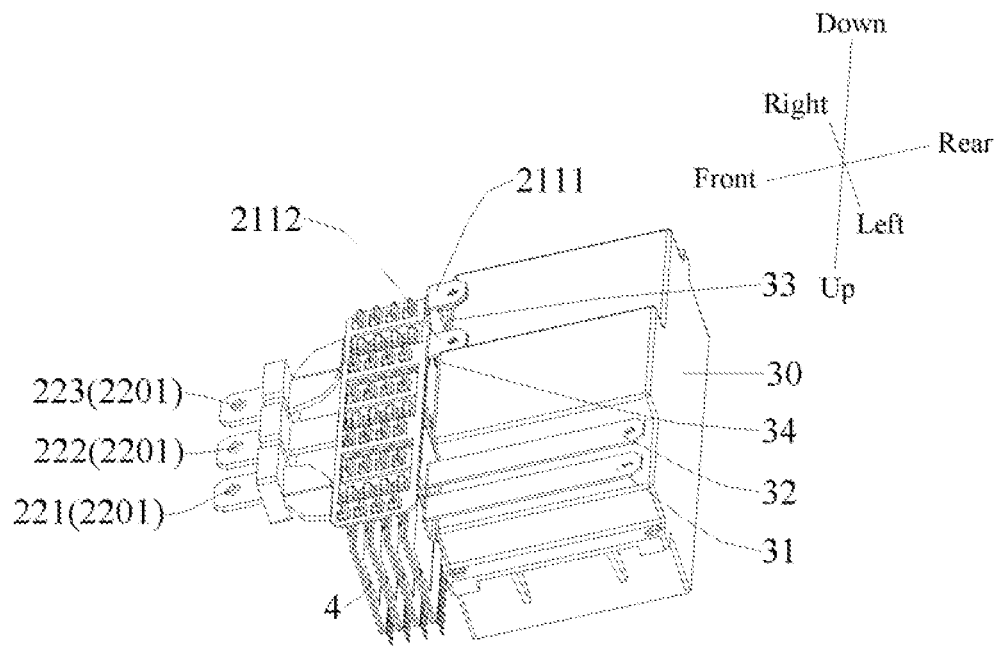
FIG. 15 is a schematic assembly diagram of a busbar module, a capacitor and an IGBT power module from a third perspective according to an embodiment of the present invention.

Specifically, as shown in FIG. 7 and FIG. 12, the busbar module 2 includes a plastic package 24, a DC busbar 21 and an AC busbar 22. The plastic package 24 injection-molds the DC busbar 21 and the AC busbar 22 into an integrated structure, so that the busbars are insulated, and the busbar module 2 is simple in structure and easy to arrange.

The DC busbar 21 includes a positive DC busbar 211 and a negative DC busbar 212. The AC busbar 22 includes a U-phase AC busbar 221, a V-phase AC busbar 222 and a W-phase AC busbar 223. The U-phase AC busbar 221, the V-phase AC busbar 222 and the W-phase AC busbar 223 are located in the same plane, and the positive DC busbar 211, the negative DC busbar 212 and the AC busbar 22 are spaced apart from one another in the up-down direction, and are stacked. Not only the space in the up-down direction is saved, but also the assembly and connection of the positive DC busbar 211, the negative DC busbar 212 and the AC busbar 22 with other components are facilitated.

It will be appreciated that the positive DC busbar 211, the negative DC busbar 212 and the AC busbar 22 are insulated from each other to avoid short circuit.

The arrangement positions of the positive DC busbar 211, the negative DC busbar 212 and the AC busbar 22 in the up-down direction may be determined according to the actual arrangement requirements of the load controller 100. In a specific embodiment shown in FIG. 7 and FIG. 8, in the busbar module 2, the positive DC busbar 211, the AC busbar 22 and the negative DC busbar 212 are sequentially arranged from up to down. Of course, in other embodiments, the positions of the negative DC busbar 212, the AC busbar 22 and the positive DC busbar 211 in the up-down direction may be different.

In some specific embodiments of the present invention, the positive DC busbar 211 and the negative DC busbar 212 have a thickness d1, and the U-phase AC busbar 221, and the V-phase AC busbar 222 and the W-phase AC busbar 223 have a thickness d2, where d1=1.5 mm, and d2=3 mm. When d1 and d2 are equal to the above values, the current of the busbar module 2 is stabilized, thereby better meeting the use requirements.

The busbar module 2 includes a first insulating layer, a second insulating layer, a third insulating layer, and a fourth insulating layer sequentially disposed in the up-down direction, one of the positive DC busbar 211, the negative DC busbar 212 and the AC busbar 22 is disposed between the first insulating layer and the second insulating layer, one of the remaining two of the positive DC busbar 211, the negative DC busbar 212 and the AC busbar 22 is disposed between the second insulating layer and the third insulating layer, and the other one of the remaining two of the positive DC busbar 211, the negative DC busbar 212 and the AC busbar 22 is disposed between the third insulating layer and the fourth insulating layer.

The first insulating layer is located on an upper surface of the uppermost busbar, the fourth insulating layer is located on a lower surface of the lowermost busbar, and the second insulating layer and the third insulating layer are located between the first insulating layer and the fourth insulating layer.

Figure 8:
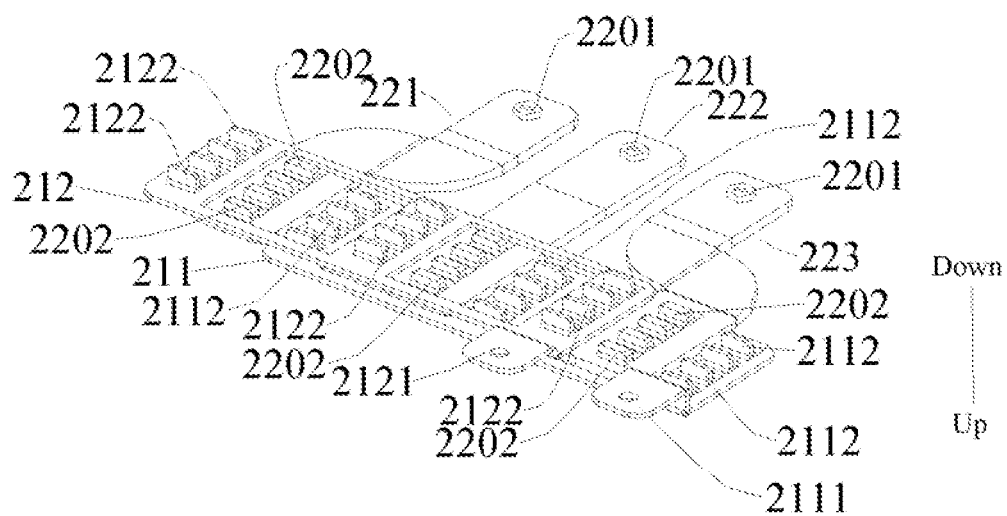
FIG. 8 is a schematic structural diagram of a DC busbar and an AC busbar according to an embodiment of the present invention.

For example, as shown in FIG. 7 and FIG. 8, the positive DC busbar 211 is disposed between the first insulating layer and the second insulating layer, the first insulating layer is located above the positive DC busbar 211, the AC busbar 22 is disposed between the second insulating layer and the third insulating layer, the negative DC busbar 212 is disposed between the third insulating layer and the fourth insulating layer, and the fourth insulating layer is located on the lower surface of the negative DC busbar 212.

In some embodiments of the present invention, the first insulating layer and the fourth insulating layer have a thickness D1, and the second insulating layer and the third insulating layer have a thickness D2, where D1=0.5 mm, and D2=1 mm. When D1 and D2 are equal to the above values, the busbar module 2 has a good insulation effect.

It will be appreciated that in the embodiment where the DC busbar 21 and the AC busbar 22 are injection-molded into an integrated structure, the plastic package 24 is injected through an injection molding process, thereby forming the first insulating layer, the second insulating layer, the third insulating layer, and the fourth insulating layer.

Figure 6:
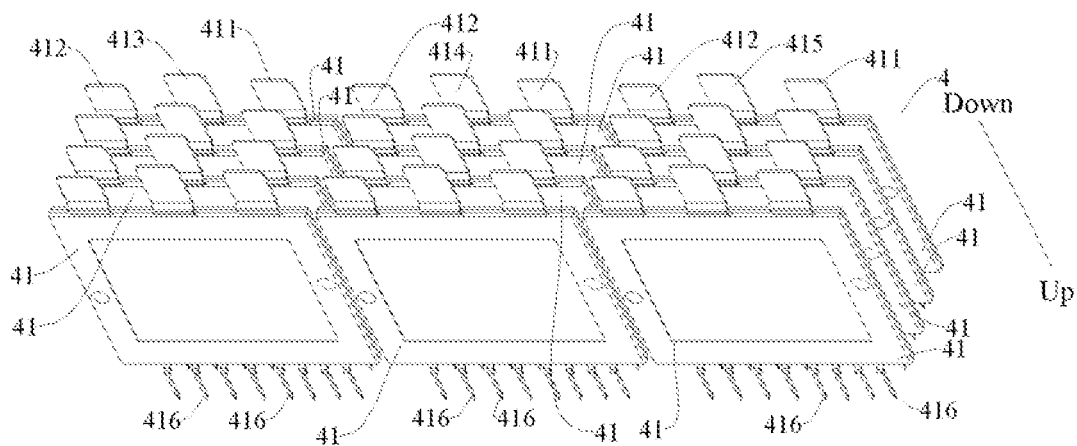
FIG. 6 is a schematic structural diagram of an IGBT power module according to an embodiment of the present invention.
Figure 18:
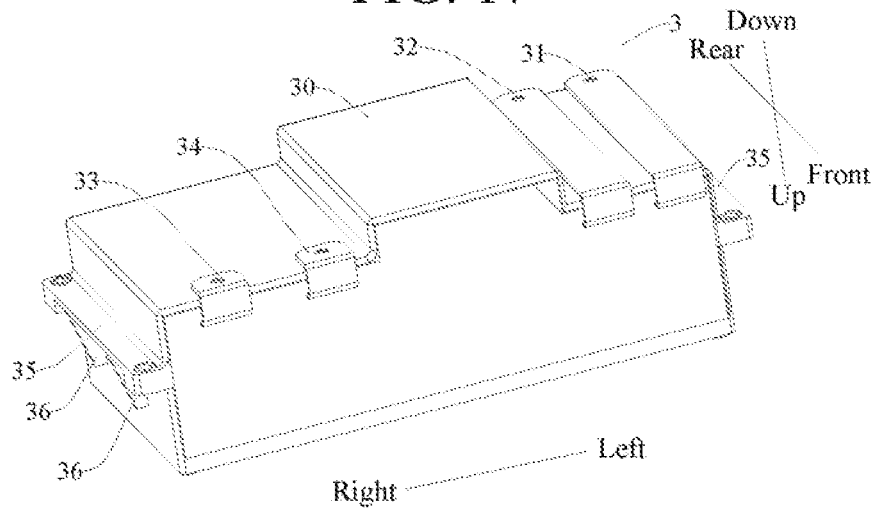
FIG. 18 is a schematic structural diagram of a capacitor according to an embodiment of the present invention.

As shown in FIG. 18, the capacitor 3 includes a capacitor body 30, a positive input terminal 31 of the capacitor 3, a negative input terminal 32 of the capacitor 3, a positive output terminal 33 of the capacitor 3, and a negative output terminal 34 of the capacitor 3. As shown in FIG. 6, the input end of each IGBT 41 includes an IGBT positive input terminal 411 and an IGBT negative input terminal 412, and the output ends of three IGBTs 41 in the same group of IGBTs are a U-phase output terminal 413, a V-phase output terminal 414 and a W-phase output terminal 415, respectively.

Figure 9:
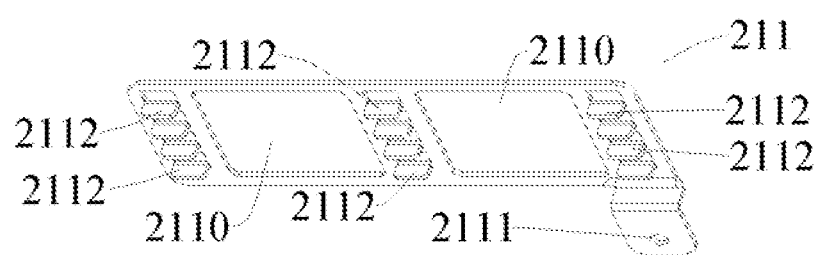
FIG. 9 is a schematic structural diagram of a positive DC busbar according to an embodiment of the present invention.

As shown in FIG. 9, the positive DC busbar 211 includes a first positive terminal 2111 and multiple second positive terminals 2112, the first positive terminal 2111 being connected to the positive output terminal 33 of the capacitor 3, the multiple second positive terminals 2112 being connected to the multiple IGBT positive input terminals 411 in one-to-one correspondence.

Preferably, a portion of the positive DC busbar 211 forms the second positive terminal 2112. For example, a portion of the positive DC busbar 211 forms the second positive terminal 2112 by stamping or injection molding, the second positive terminal 2112 is compact in structure, the number of the second positive terminal 2112 can be determined according to the requirements of the IGBT power module 4, and the density of the second positive terminal 2112 can be higher, thereby making it more convenient for the positive DC busbar 211 to be connected to the IGBT power module 4 having a high terminal density and a small size.

More preferably, one end of the second positive terminal 2112 is connected to the remaining portion of the positive DC busbar 211, and the other end of the second positive terminal 2112 is a free end. Thus, the second positive terminal 2112 and the remaining portion of the positive DC busbar 211 are at an angle, that is, the two are not in one plane, thereby reserving an operation space for the connection of the second positive terminal 2112 and the corresponding IGBT positive input terminal 411. The connection is more convenient, and the connection efficiency is high.

Preferably, the second positive terminal 2112 is perpendicular to the remaining portion of the positive DC busbar 211, the second positive terminal 2112 is more conveniently connected to the IGBT positive input terminal 411, and the components formed by connecting the busbar module 2 and the IGBT power module 4 occupy a small space.

Figure 10:
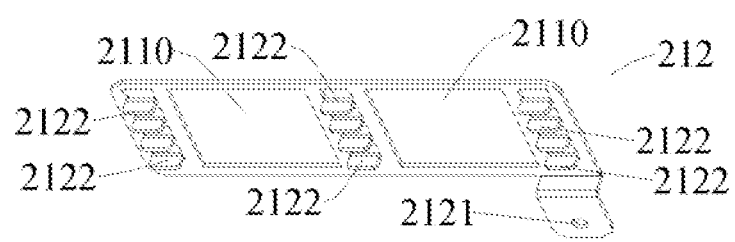
FIG. 10 is a schematic structural diagram of a negative DC busbar according to an embodiment of the present invention.

As shown in FIG. 10, the negative DC busbar 212 includes a first negative terminal 2121 and multiple second negative terminals 2122, the first negative terminal 2121 being connected to the negative output terminal 34 of the capacitor 3, the multiple second negative terminals 2122 being connected to the multiple IGBT negative input terminals 412 in one-to-one correspondence.

Preferably, a portion of the negative DC busbar 212 forms the second negative terminal 2122. For example, a portion of the negative DC busbar 212 forms the second negative terminal 2122 by stamping or injection molding, the second negative terminal 2122 is compact in structure, the number of the second negative terminal 2122 can be determined according to the requirements of the IGBT power module 4, and the density of the second negative terminal 2122 can be higher, thereby making it more convenient for the negative DC busbar 212 to be connected to the IGBT power module 4 having a high terminal density and a small size.

More preferably, one end of the second negative terminal 2122 is connected to the remaining portion of the negative DC busbar 212, and the other end of the second negative terminal 2122 is a free end. Thus, the second negative terminal 2122 and the remaining portion of the negative DC busbar 212 are at an angle, that is, the two are not in one plane, thereby reserving an operation space for the connection of the second negative terminal 2122 and the corresponding IGBT negative input terminal 412. The connection is more convenient, and the connection efficiency is high.

Preferably, the second negative terminal 2122 is perpendicular to the remaining portion of the negative DC busbar 212, the second negative terminal 2122 is more conveniently connected to the IGBT negative input terminal 412, and the components formed by connecting the busbar module 2 and the IGBT power module 4 occupy a small space.

Figure 11:
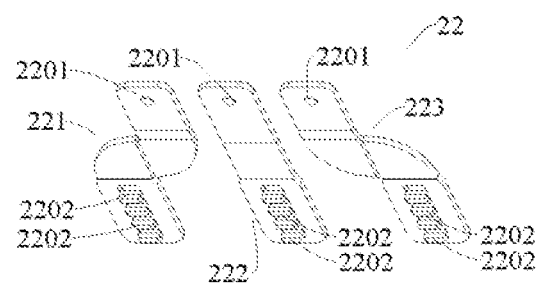
FIG. 11 is a schematic structural diagram of an AC busbar according to an embodiment of the present invention.

As shown in FIG. 11, the U-phase AC busbar 221, the V-phase AC busbar 222 and the W-phase AC busbar 223 each include a first output terminal 2201 and at least one second output terminal 2202.

The first output terminal 2201 is adapted to be connected to a corresponding phase input end of the load. That is, the first output terminal 2201 of the U-phase AC busbar 221 is adapted to be connected to a U-phase input end of the load, the first output terminal 2201 of the V-phase AC busbar 222 is adapted to be connected to a V-phase input end of the load, and the first output terminal 2201 of the W-phase AC busbar 223 is adapted to be connected to a W-phase input end of the load.

Preferably, as shown in FIG. 2, the first output terminal 2201 is adapted to extend out of the casing 1 to facilitate connection with an external load.

As shown in FIG. 7, each first output terminal 2201 is provided with a current sensor 23. The current sensor 23 is adapted to detect the magnitude of current of AC power passing through the corresponding phase AC busbar, and the control circuit board 62 may control the magnitude of current passing through each phase AC busbar according to a detection value of the current sensor 23 to avoid overcurrent.

At least one second output terminal 2202 is connected to a corresponding phase output terminal in at least one column of IGBTs in one-to-one correspondence. As shown in FIG. 6, the IGBT 41 module includes four columns of IGBTs 41, each column of IGBTs having a U-phase output terminal 413, a V-phase output terminal 414 and a W-phase output terminal 415. The U-phase AC busbar 221, the V-phase AC busbar 222 and the W-phase AC busbar 223 each include four second output terminals 2202. The four second output terminals 2202 of the U-phase AC busbar 221 are connected to the four U-phase output terminals 413 in the four columns of IGBTs in one-to-one correspondence. The four second output terminals 2202 of the V-phase AC busbar 222 are connected to the four V-phase output terminals 414 in the four columns of IGBTs in one-to-one correspondence. The four second output terminals 2202 of the W-phase AC busbar 223 are connected to the four W-phase output terminals 415 in the four columns of IGBTs in one-to-one correspondence.

Preferably, a portion of each of the U-phase AC busbar 221, the V-phase AC busbar 222 and the W-phase AC busbar 223 forms the second output terminal 2202. For example, a portion of the U-phase AC busbar 221 may form the second output terminal 2202 of the U-phase AC busbar 221 by stamping or injection molding, a portion of the V-phase AC busbar 222 may form the second output terminal 2202 of the V-phase AC busbar 222 by stamping or injection molding, and a portion of the W-phase AC busbar 223 may form the second output terminal 2202 of the W-phase AC busbar 223 by stamping or injection molding. The second output terminal 2202 is compact in structure, the number of the second output terminal 2202 can be determined according to the requirements of the IGBT power module 4, and the density of the second output terminal 2202 can be higher, thereby making it more convenient for the AC busbar 22 to be connected to the IGBT power module 4 having a high terminal density and a small size.

More preferably, one end of the second output terminal 2202 is connected to the remaining portion of the corresponding phase AC busbar, and the other end of the second output terminal 2202 is a free end. Thus, the second output terminal 2202 and the remaining portion of the corresponding phase AC busbar are at an angle, that is, the two are not in one plane, thereby reserving an operation space for the connection of the second output terminal 2202 and the corresponding phase output terminal of the IGBT power module 4. The connection is more convenient, and the connection efficiency is high.

Preferably, the second output terminal 2202 is perpendicular to the remaining portion of the corresponding phase AC busbar, the second output terminal 2202 is more conveniently connected to the corresponding phase output terminal of the IGBT power module 4, and the components formed by connecting the busbar module 2 and the IGBT power module 4 occupy a small space.

Further, the first positive terminal 2111 and the first negative terminal 2121 are plate-shaped bodies extending from the corresponding busbars, whereby the structure of the busbar module 2 is simpler, and the connection of the busbar module 2 and the capacitor 3 is more convenient. The first output terminal 2201 is a plate-shaped body extending from the corresponding busbar, whereby the structure of the busbar module 2 is simpler, and the connection of the busbar module 2 and the motor 200 is more convenient.

Preferably, the busbar module 2 is detachably connected to the capacitor 3 to facilitate the assembly of the load controller 100 and the arrangement of internal components. Specifically, the first positive terminal 2111 and the positive output terminal 33 of the capacitor 3 are connected by a threaded fastener. The first negative terminal 2121 and the negative output terminal 34 of the capacitor 3 are connected by a threaded fastener.

Preferably, the busbar module 2 is detachably connected to the load, thereby facilitating the replacement and maintenance of the load and the busbar module 2. Specifically, the first output terminal 2201 of the U-phase AC busbar 221 and the U-phase input end of the load are connected by a threaded fastener, the first output terminal 2201 of the V-phase AC busbar 222 and the V-phase input end of the load are connected by a threaded fastener, and the first output terminal 2201 of the W-phase AC busbar 223 and the W-phase input end of the load are connected by a threaded fastener.

More preferably, the multiple second positive terminals 2112 and the multiple IGBT positive input terminals 411 are welded in one-to-one correspondence, the multiple second negative terminals 2122 and the multiple IGBT negative input terminals 412 are welded in one-to-one correspondence, and at least one second output terminal 2202 and the corresponding phase output terminal in at least one column of IGBTs are welded in one-to-one correspondence. That is, the second output terminal 2202 of the U-phase AC busbar 221 and the corresponding U-phase output terminal 413 are welded, the second output terminal 2202 of the V-phase AC busbar 222 and the corresponding V-phase output terminal 414 are welded, and the second output terminal 2202 of the W-phase AC busbar 223 and the corresponding W-phase output terminal 415 are welded. Therefore, the terminal of the busbar module 2 and the terminal of the IGBT 41 are welded without a fastener. Thus, it is not necessary to provide mounting holes on the busbars of the busbar module 2, which can reduce the cumbersome production process, improve the production efficiency in mass production, reduce the assembly and material costs brought by the fastener, reduce the weight of a product, and more meet the connection requirement of the busbar module 2 and the small-sized IGBT 41.

Further, the second positive terminal 2112 and the corresponding IGBT positive input terminal 411 are attached in parallel and both are flat plates, the second negative terminal 2122 and the corresponding IGBT negative input terminal 412 are attached in parallel and both are flat plates, and the second output terminal 2202 and the corresponding phase output terminal in the IGBT power module 4 are attached in parallel and both are flat plates. That is, the U-phase output terminal 413, the V-phase output terminal 414, the W-phase output terminal 415 and the corresponding second output terminal 2202 are attached in parallel and all are flat plates. Therefore, two terminals connected in one-to-one correspondence have a simple structure, a large contact area, good contact, and stable current transmission.

Preferably, the IGBT positive input terminal 411, the IGBT negative input terminal 412, the U-phase output terminal 413, the V-phase output terminal 414, and the W-phase output terminal 415 in the same column of IGBTs are located in the same plane, and thus the corresponding second positive terminal 2112, second negative terminal 2122 and second output terminal 2202 are also located in the same plane. Therefore, the connection and assembly of the busbar module 2 and the IGBT power module 4 are more convenient, the structure is compact, and the occupied space is small.

Further, the number of the second positive terminal 2112, the second negative terminal 2122 and the second output terminal 2202 in the busbar module 2 may be determined according to the requirements of the IGBT power module 4, and the modular design of the busbar module 2 and the arrangement mode of the terminals thereof may make the busbar module 2 more suitable for connection with multiple small-sized IGBTs 41 having a high terminal density.

As shown in FIG. 7 and FIG. 12, in order to facilitate the connection between the busbar module 2 and the IGBT power module 4, the second positive terminal 2112, the second negative terminal 2122 and the second output terminal 2202 of the busbar module 2 are all exposed from the plastic package 24. Specifically, the plastic package 24 is provided with multiple plastic package through holes 241, and the second positive terminal 2112, the second negative terminal 2122 and the second output terminal 2202 are all exposed from the corresponding plastic package through holes 241.

As shown in FIG. 9 and FIG. 10, the positive DC busbar 211 and the negative DC busbar 212 each have a DC busbar through hole 2110, and wiring terminals of other busbars other than the busbar in which the DC busbar through hole 2110 is located are adapted to be exposed from the DC busbar through hole 2110.

A specific embodiment shown in FIG. 7 and FIG. 8 is taken as an example. The positive DC busbar 211, the corresponding phase AC busbar and the negative DC busbar 212 are sequentially disposed from up to down, and a wiring terminal of the negative DC busbar 212 and a wiring terminal of the corresponding phase AC busbar are both exposed from the DC busbar through hole 2110 of the positive DC busbar 211. Therefore, the DC busbar through hole 2110 facilitates exposure of wiring terminals of other busbars other than the busbar in which the DC busbar through hole 2110 is located.

Preferably, the positive DC busbar 211 and the negative DC busbar 212 have the same structure and may be manufactured by the same mold, thereby saving manufacturing costs.

Preferably, the positive DC busbar 211, the negative DC busbar 212 and the AC busbar 22 are all copper plates, and have low electrical resistivity and excellent electrical conductivity.

Figure 3:
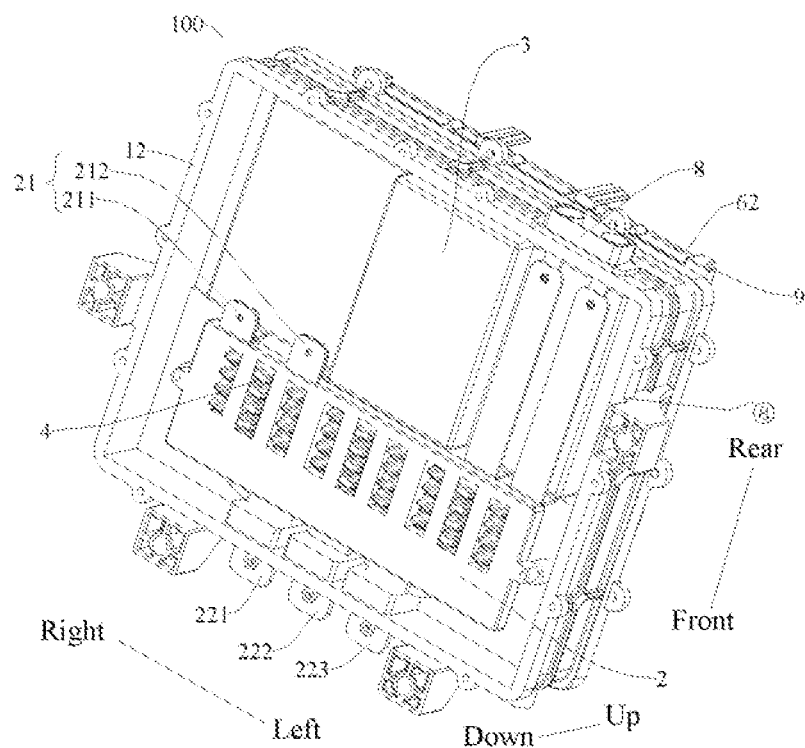
FIG. 3 is a schematic structural diagram of a load controller from a second perspective according to an embodiment of the present invention.
Figure 5:
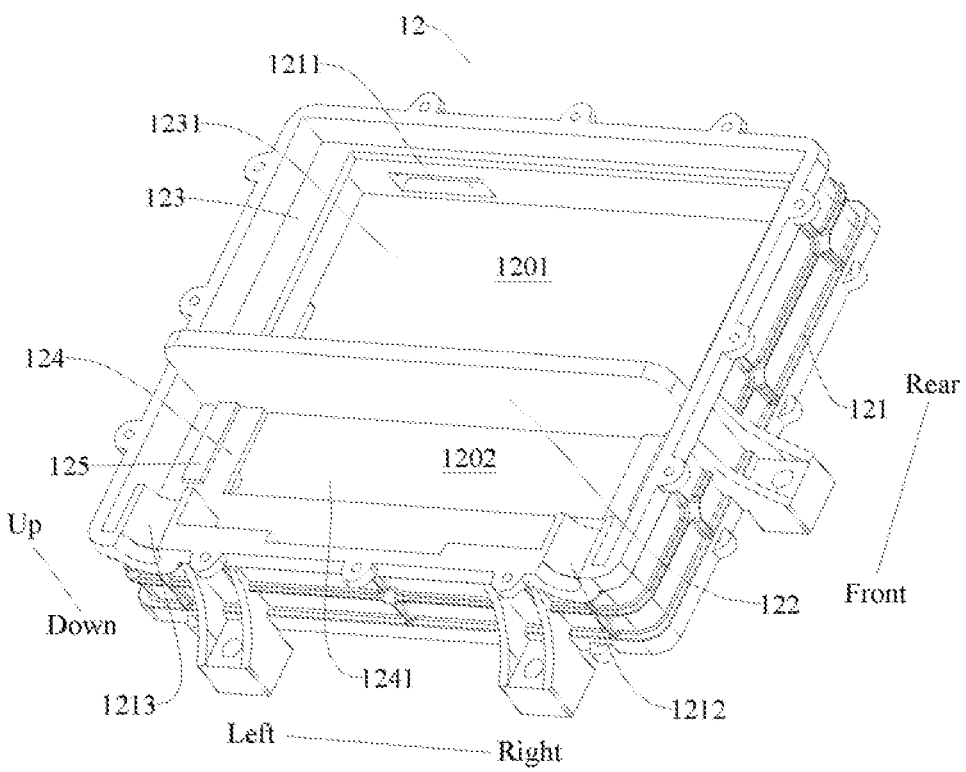
FIG. 5 is a schematic structural diagram of a lower casing of a load controller according to an embodiment of the present invention.
Figure 21:
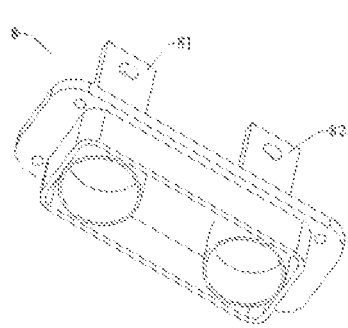
FIG. 21 is a schematic structural diagram of a connector according to an embodiment of the present invention.

As shown in FIG. 3 and FIG. 21, the load controller 100 according to an embodiment of the present invention further includes a connector 8. As shown in FIG. 3, the connector 8 is disposed on the casing 1. As shown in FIG. 5, the casing 1 is provided with a connector mounting hole 1211, and the connector 8 is disposed in the connector mounting hole 1211.

As shown in FIG. 21, the connector 8 includes a connector positive output terminal 81 and a connector negative output terminal 82, the connector positive output terminal 81 being connected to the positive input terminal 31 of the capacitor 3, the connector negative output terminal 82 being connected to the negative input terminal 32 of the capacitor 3. That is to say, the connector 8 is a connecting device between the external DC power supply and the capacitor 3. By providing the connector 8, the structure of the capacitor 3 and the external DC power supply can be simplified.

Preferably, the connector 8 is detachably connected to the capacitor 3, and the connector 8 is detachably connected to the external DC power supply, thereby facilitating maintenance, assembly and replacement of the external DC power supply and the load controller 100. Specifically, the connector positive output terminal 81 is connected to the positive input terminal 31 of the capacitor 3 through a threaded connecting member, and the connector negative output terminal 82 is connected to the negative input terminal 32 of the capacitor 3 through a threaded connecting member.

Figure 19:
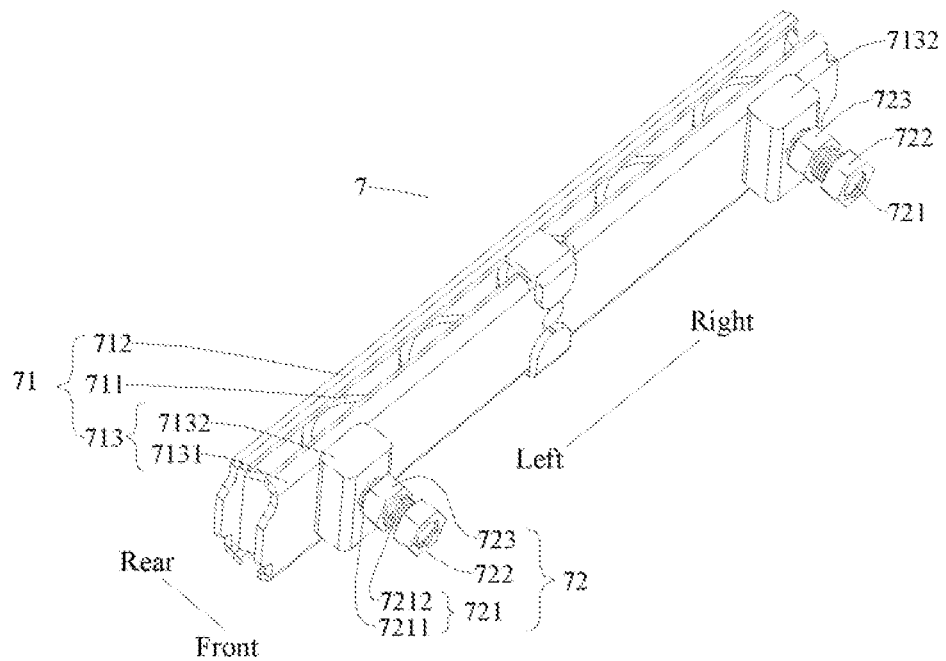
FIG. 19 is a schematic structural diagram of a pressing device according to an embodiment of the present invention.
Figure 20:
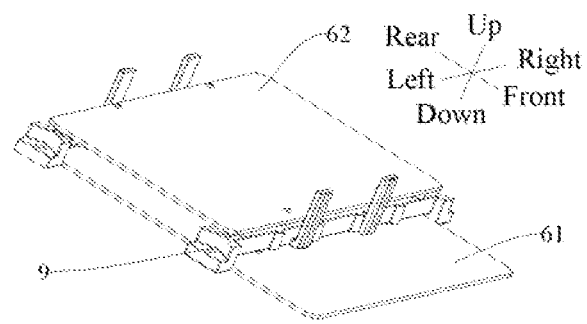
FIG. 20 is a schematic structural diagram of a driving circuit board and a control circuit board according to an embodiment of the present invention.

As shown in FIG. 2 and FIG. 19, the load controller 100 according to an embodiment of the present invention may further include a pressing device 7. The pressing device 7 is elastically clamped between the casing 1 and the heat-dissipating module 5 to adjust the magnitude of a clamping force of adjacent two heat-dissipating fins 53 on the IGBT 41 between the adjacent two heat-dissipating fins 53. That is to say, the pressing device 7 is adapted to clamp each IGBT 41 between adjacent two heat-dissipating fins 53 in the heat-dissipating module 5, and may adjust the magnitude of a clamping force on the IGBT 41.

The load controller 100 according to an embodiment of the present invention is provided with the pressing device 7, which provides an appropriate clamping force for the IGBT 41 by the adjacent two heat-dissipating fins 53, so that the heat-dissipating module 5 and the IGBT power module 4 are relatively fixed, the IGBT power module 4 is prevented from shaking, and each IGBT 41 is in close contact with the corresponding two heat-dissipating fins 53 to improve the cooling effect.

In some embodiments of the present invention, the pressing device 7 includes an elastic component 71 and an adjusting component 72. The elastic component 71 is clamped between the adjusting component 72 and the heat-dissipating module 5. The adjusting component 72 is adapted to adjust the magnitude of an elastic force applied by the elastic component 71 to the heat-dissipating module 5. The effect of adjusting the magnitude of the clamping force applied to the IGBT 41 is finally achieved.

The elastic component 71 may include an elastic member 711, and a first fixing plate 712 and a second fixing plate 713 disposed oppositely. The elastic member 711 is clamped between the first fixing plate 712 and the second fixing plate 713. The first fixing plate 712 is in contact with the heat-dissipating module 5. The adjusting component 72 is used for adjusting a distance between the second fixing plate 712 and the first fixing plate 713. The effect of adjusting the magnitude of the clamping force applied to the IGBT 41 is finally achieved. The elastic member 71 adopts the above structure to make the heat-dissipating module 5 more uniformly stressed.

Alternatively, the elastic member 711 is a corrugated elastic sheet, a wave crest of the corrugated elastic sheet abuts against the second fixing plate 713, and a wave trough of the corrugated elastic sheet abuts against the first fixing plate 712.

Of course, the structure of the elastic member 711 is not limited thereto, and the elastic member 711 may also include multiple coil springs disposed side by side.

The adjusting component 72 includes a stud 721 and a nut 722. The stud 721 includes a left-handed threaded section 7211 and a right-handed threaded section 7212. The second fixing plate 713 is provided with a left-handed threaded hole fitting the left-handed threaded section 7211. The nut 722 is fixed to the casing 1. The nut 722 fits the right-handed threaded section 7212. An external thread of the left-handed threaded section 7211 and an internal thread of the left-handed threaded hole are both left-handed threads, and an external thread of the right-handed threaded section 7212 and an internal thread of the nut 722 are both right-handed threads.

Since the nut 722 is fixed to the casing 1, when the stud 721 is rotated, the second fixing plate 713 may move toward the first fixing plate 712 or move away from the first fixing plate 712, thereby making the elastic member 711 in a different compression state, and adjusting the magnitude of an elastic force applied to the heat-dissipating module 5.

Preferably, the second fixing plate 713 includes a fixing plate body 7131 and a fixing block 7132. The fixing block 7132 is fixed to the fixing plate body 7131. The left-hand threaded hole is provided on the fixing block 7132. By providing the fixing block 7132, the structural strength of a joint between the stud 721 and the left-hand threaded hole can be enhanced, and the reliability of the pressing device 7 can be improved.

Preferably, the first fixing plate 712 and the fixing plate body 7131 have the same structure and may be manufactured by the same mold, which saves manufacturing costs and has good versatility.

Further, the adjusting component 72 may further include a wrench nut 723. The wrench nut 723 is fixed to the stud 721, and the wrench nut 723 is located between the left-handed threaded section 7211 and the right-handed threaded section 7212. The wrench nut 723 is adapted to fit a wrench so that a worker can rotate the stud 721, which is convenient and labor-saving.

The arrangement of the casing 1 of the load controller 100 and the components inside the casing 1 according to an embodiment of the present invention will be described below with reference to FIG. 2 to FIG. 5.

Figure 4:
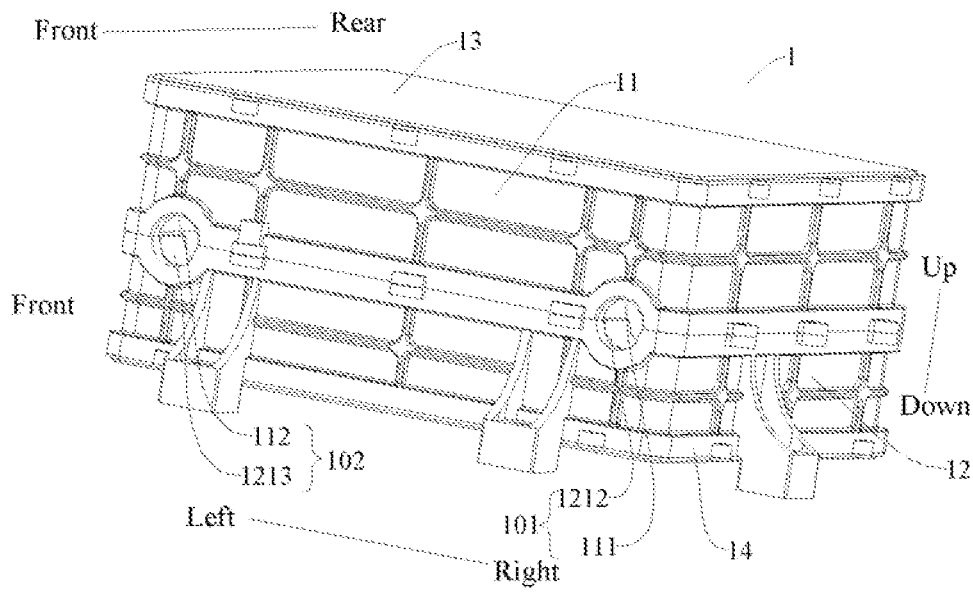
FIG. 4 is a schematic structural diagram of a casing of a load controller according to an embodiment of the present invention.

As shown in FIG. 4, the casing 1 may include an upper casing 11 and a lower casing 12. The upper casing 11 is detachably connected above the lower casing 12. The busbar module 2, the IGBT power module 4, the heat-dissipating module 5, the driving circuit board 61 and the control circuit board 62 are all disposed on the lower casing 12. The upper casing 11 serves only as an accommodation space for accommodating the portions of some components (for example, the driving circuit board 61, the control circuit board 62, the IGBT power module 4, and the heat-dissipating module 5) beyond the lower casing 12. The components are uniformly disposed on the lower casing 12, the integration degree is high, and the assembly is convenient. The upper casing 11 and the lower casing 12 are detachably connected, which facilitates the assembly of the casing 1 and facilitates maintenance and replacement of components in the casing 1.

As shown in FIG. 5, the lower casing 12 includes a frame 121 and an intermediate wall 122. The intermediate wall 122 is connected to the frame 121, and the intermediate wall 122 partitions the frame 121 into a first space 1201 and a second space 1202. The first space 1201 is provided with the capacitor 3 inside, and the second space 1202 is provided with the heat-dissipating module 5 inside. The capacitor 3 and the heat-dissipating module 5 are separated by the intermediate wall 122, so that some areas in the casing 1 is provided with different components, which are high in modularity, easy to distinguish, and easy to mount.

The frame 121 may be rectangular, and both ends of the intermediate wall 122 are respectively connected to two opposite side walls of the frame 121. The lower frame 121 has a simple structure and a clear partition.

The first space 1201 of the frame 121 is provided with a first bottom plate 123 inside. The first bottom plate 123 is connected to the frame 121. The first bottom plate 123 has a first mounting through hole 1231. The capacitor 3 is detachably connected to the first bottom plate 123, and the capacitor 3 partially passes downward through the first mounting through hole 1231. Specifically, as shown in FIG. 18, both ends of the capacitor 3 are separately provided with a lap plate 35 lapping the first bottom plate 123, the lap plate 35 may be supported on the first bottom plate 123, and the lap plate 35 and the first bottom plate 123 are detachably connected by a threaded connecting member, so as to detachably connect the capacitor 3 to the first bottom plate 123. A reinforcing structure, such as a reinforcing rib 36, may be provided between the lap plate 35 and the capacitor body 30 to provide sufficient strength for the connection of the capacitor 3 and the first bottom plate 123.

As shown in FIG. 5, the second space 1202 of the frame 121 is provided with a second bottom plate 124 inside. The second bottom plate 124 is connected to the second space 1202. The second bottom plate 124 is provided with a boss 125, and the heat-dissipating module 5 is supported on the boss 125. Therefore, the heat-dissipating module 5 has a better cooling effect.

Specifically, the boss 125 may be provided on an upper surface of the second bottom plate 124, and the heat-dissipating module 5 is supported on the boss 125. The heat-dissipating module 5 is located above the second bottom plate 124, and the busbar module 2 is located below the second bottom plate 124. More specifically, the boss 125 may include two sub-portions spaced apart from each other, so that the boss 125 occupies a small space, and can better support the heat-dissipating module 5.

Further, as shown in FIG. 5, the second bottom plate 124 is provided with a second mounting through hole 1241. Since each IGBT 41 in each column of IGBTs is sandwiched between adjacent two heat-dissipating fins 53 of the heat-dissipating module 5, the input end of each IGBT 41 of the IGBT power module 4 passes through the second mounting through hole 1241 and is connected to the DC busbar 21, and the output end of each IGBT 41 passes through the second mounting through hole 1241 and is connected to the AC busbar 22.

The input end of each IGBT 41 and the output end of each IGBT 41 are both located at a lower end of the IGBT 41. A power terminal 416 of each IGBT 41 is located at an upper end of the IGBT 41. A portion of the driving circuit board 61 is located above the heat-dissipating module 5, thereby facilitating electrical connection of the driving circuit board 61 and the IGBT power module 4.

As shown in FIG. 2, the load controller 100 according to an embodiment of the present invention may further include a fixing bracket 9. The fixing bracket 9 may be fixed to the lower casing 12. The control circuit board 62 is fixed to an upper surface of the fixing bracket 9. The driving circuit board 61 is fixed to a lower surface of the fixing bracket 9. The fixing bracket 9 is located above the capacitor 3. Therefore, the control circuit board 62 and the driving circuit board 61 are both fixed to the lower casing 12 by the fixing bracket 9. The modular design makes the assembly of the load controller 100 more convenient, the arrangement of internal components is tidier, and the space utilization rate is higher.

Further, the pressing device 7 is disposed in the second space 1202, the pressing device 7 is elastically clamped between the frame 121 and the heat-dissipating module 5, and an end surface of the heat-dissipating module 5 away from the pressing device 7 is pressed against the intermediate wall 122.

In the embodiment where the adjusting component 72 of the pressing device 7 includes the stud 721 and the nut 722, the frame 121 is provided with a nut mounting groove, and the nut 722 is fixed in the nut mounting groove.

As shown in FIG. 2, FIG. 4 and FIG. 5, in order to facilitate the connection of the main water inlet pipe 51 and the main water outlet pipe 52 of the heat-dissipating module 5 to an external pipeline, a portion of the main water inlet pipe 51 and the main water outlet pipe 52 protrudes out of the casing 1. Specifically, the upper casing 11 is provided with a first water inlet half hole 111 and a first water outlet half hole 112, and the lower casing 12 is provided with a second water inlet half hole 1212 and a second water outlet half hole 1213. The upper casing 11 is detachably connected to the lower casing 12, such that the first water inlet half hole 111 and the second water inlet half hole 1212 together define a main water inlet pipe hole 101, and the first water outlet half hole 112 and the second water outlet half hole 1213 together define a main water outlet pipe hole 102. The main water inlet pipe 51 passes through the main water inlet pipe hole 101, and the main water outlet pipe 52 passes through the main water outlet pipe hole 102.

Preferably, the casing 1 may further include an upper cover 13 and a lower cover 14. The upper cover 13 is detachably connected to the upper casing 11 to close an upper open end of the upper casing 11. The lower cover 14 is detachably connected to the lower casing 12 to close a lower open end of the lower casing 12. Therefore, the casing 1 defines a sealed space to prevent the busbar module 2, the IGBT power module 4, the heat-dissipating module 5, the driving circuit board 61 and the control circuit board 62 located in the casing 1 from being corroded by external impurities and water vapor, thereby improving the working stability, reliability and safety of the load controller 100.

As can be seen from the above description, the layout of the casing 1 and the components in the casing 1 is as follows: as shown in FIG. 2, from rear to front: a rear wall of the frame 121, the capacitor 3, the intermediate wall 122, the heat-dissipating module 5, the IGBT power module 4, the pressing device 7, and a front wall of the frame 121, where each column of IGBTs of the IGBT power module 4 is sandwiched between adjacent two heat-dissipating fins 53 of the heat-dissipating module 5; at the front part of the load controller 100, from down to up: the lower cover 14, the busbar module 2, the IGBT power module 4, the heat-dissipating module 5, the driving circuit board 61, and the upper cover 13; and at the rear part of the load controller 100, from down to up: the lower cover 14, the capacitor 3, the driving circuit board 61, the fixing bracket 9, the control circuit board 62, and the upper cover 13.

The assembly steps of the load controller 100 according to an embodiment of the present invention will be briefly described below with reference to FIG. 2 and FIG. 3. First, each column of IGBTs of the IGBT power module 4 is bonded and fixed to an appropriate position between adjacent two heat-dissipating fins 53 of the heat-dissipating module 5 to achieve an optimal cooling effect. Then, the lower casing 12 is placed in a flat position. Then, the heat-dissipating module 5 and the IGBT power module 4, mutually bonded, are placed in the upper half of the front portion of the lower casing 12, the main water inlet pipe 51 of the heat-dissipating module 5 is placed at the second water inlet half hole 1212 and the main water outlet pipe 52 is placed at the second water outlet half hole 1213, a portion of the main water inlet pipe 51 and the main water outlet pipe 52 extends out of the lower casing 12, an end surface of the rearmost heat-dissipating fin 53 of the heat-dissipating module 5 is attached to the intermediate wall 122 of the lower casing 12, and the heat-dissipating module 5 is fixed and pressed by the pressing device 7. Then, the lower casing 12 is turned over to face down and horizontally placed on a jig, three terminals (the IGBT positive input terminal 411, the corresponding phase output terminal and the IGBT negative input terminal 412) of each IGBT 41 of the IGBT power module 4 and the second positive terminal 2112 of the positive DC busbar 211 of the busbar module 2, the second output terminal 2202 of the corresponding phase AC busbar and the second negative terminal 2122 of the negative DC busbar 212 are attached in parallel and welded at a high frequency to complete the fixing and electrical connection of the IGBT power module 4 and the busbar module 2. Then, the lower casing 12 is turned over to face up, and the capacitor 3 is placed in the rear half part of the lower casing 12 and is fixed to the first bottom plate 123 by a threaded fastener. Then, the lower casing 12 is turned over to face down, and the positive output terminal 33 of the capacitor 3 and the negative output terminal 34 of the capacitor 3 are connected to the first positive terminal 2111 of the corresponding positive DC busbar 211 and the first negative terminal 2121 of the negative DC busbar 212 by threaded fasteners, thereby realizing electrical connection of DC from the capacitor 3 to the busbar module 2. Then, the connector 8 is disposed on the lower casing 12, and the connector positive output terminal 81 and the connector negative output terminal 82 of the connector 8 are connected to the positive input terminal 31 of the capacitor 3 and the negative input terminal 32 of the capacitor 3, thereby completing electrical connection of external DC from the connector 8 to the capacitor 3. Then, the lower casing 12 is turned over to face up, the fixing bracket 9 fixing the driving circuit board 61 and the control circuit board 62 is fixed to the lower casing 12, so that the driving circuit board 61 is electrically connected to the power terminal 416 of the IGBT power module 4. The upper casing 11 is fixed to the lower casing 12 by a threaded fastener, the upper cover 13 is fixed to the upper end of the upper casing 11 by a threaded fastener, and the lower cover 14 is fixed to the lower end of the lower casing 12 by a threaded fastener.

In short, the IGBT power module 4 of the load controller 100 according to an embodiment of the present invention is small in size, and the heat-dissipating module 5 realizes double-sided cooling for the IGBT power module 4, thereby reducing the size and the weight, and improving the power density and the cooling efficiency. In addition, in the busbar module 2 of the load controller 100 according to an embodiment of the present invention, the DC busbar 21 and the AC busbar 22 are integrally injection-molded, and the positive DC busbar 211, the negative DC busbar 212 and the AC busbar 22 are stacked. The modular and integrated arrangement of the busbar module 2 greatly simplifies the electrical connection mode. The arrangement position and arrangement mode of the busbar module 2, the IGBT power module 4, the heat-dissipating module 5, the driving circuit board 61, the control circuit board 62, the pressing device 7 and the connectors 8 make the load controller 100 more compact in structure, small in space occupation and high in assembly efficiency.

In short, the electric vehicle 1000 according to an embodiment of the present invention is provided with the foregoing load controller 100 which is high in modularity, easy to assemble, light in weight, small in size, high in cooling efficiency and high in power density, thereby realizing connection between the power battery pack 300 and the load. Moreover, the connection structure is simple and reliable, and the safety is high.

In the description of the present invention, it should be understood that, orientations or position relationships indicated by terms such as "center", "longitudinal", "transverse", "length", "width", "thickness", "up", "down", "front", "back", "left", "right", "vertical", "horizontal", "top", "bottom", "inner", "outer", "clockwise", "counterclockwise", "axial", "radial", and "circumferential" are orientations or position relationship shown based on the accompanying drawings, and are merely used for describing the present invention and simplifying the description, rather than indicating or implying that the apparatus or element should have a particular orientation or be constructed and operated in a particular orientation, and therefore, should not be construed as a limitation on the present invention.

In addition, terms "first" and "second" are used only for description purposes, and shall not be understood as indicating or suggesting relative importance or implicitly indicating a quantity of indicated technical features. Therefore, features defined by "first" and "second" may explicitly or implicitly include at least one feature. In the description of the present invention, unless otherwise specifically limited, "multiple" means at least two, for example, two or three.

In the present invention, it should be noted that unless otherwise clearly specified and limited, the terms "disposed", "connected", "connection", and "fixed" should be understood in a broad sense. For example, a connection may be a fixed connection, a detachable connection, or an integral connection; may be a mechanical connection or an electrical connection or mutual communication; may be a direct connection or an indirect connection by means of an intermediate medium; or may be internal communication between two elements or interaction relationship between two elements, unless otherwise clearly limited. A person of ordinary skill in the art may understand specific meanings of the terms in the present invention according to specific situations.

In the present invention, unless otherwise clearly specified and limited, that a first feature is "above" or "below" a second feature may be that the first and the second features are in contact with each other directly, or the first and the second features are in contact with each other indirectly by using an intermediate medium. Moreover, that the first feature is "above", "over", and "on" the second feature may be that the first feature is right above the second feature or at an inclined top of the second feature, or may merely indicate that the horizontal height of the first feature is higher than that of the second feature. That the first feature is "below", "under", and "beneath" the second feature may be that the first feature is right below the second feature or at an inclined bottom of the second feature, or may merely indicate that the horizontal height of the first feature is lower than that of the second feature.

In the description of the specification, the description made with reference to terms such as "one embodiment", "some embodiments", "example", "specific example", or "some examples" means that a specific characteristic, structure, material or feature described with reference to the embodiment or example is included in at least one embodiment or example of the present invention. In this specification, exemplary descriptions of the foregoing terms do not necessarily refer to a same embodiment or example. In addition, the described specific features, structures, materials, or characteristics may be combined in a proper manner in any one or more of the embodiments or examples. In addition, a person skilled in the art may integrate or combine different embodiments or examples and characteristics of different embodiments or examples described in the specification, as long as they do not conflict each other.

Although the embodiments of the present invention are shown and described above, it can be understood that, the foregoing embodiments are exemplary, and cannot be construed as a limitation to the present invention. Within the scope of the present invention, a person of ordinary skill in the art may make changes, modifications, replacement, and variations to the foregoing embodiments.

What is claimed is:
1. A load controller, comprising:
a casing;

a busbar module, the busbar module comprising a DC busbar and an AC busbar, and the AC busbar is configured to be connected to a load;

a capacitor, configured to be connected to an external DC power supply, and connected to the DC busbar;

an IGBT power module, the IGBT power module comprising at least one column of IGBTs, one column of IGBTs comprising a plurality of IGBTs, an input end of each IGBT being connected to the DC busbar, and an output end of each IGBT being connected to the AC busbar; and a heat-dissipating module, the heat-dissipating module comprising a plurality of heat-dissipating fins, and each IGBT in the same column of IGBTs being sandwiched between two adjacent heat-dissipating fins, wherein the busbar module, the IGBT power module, and the heat-dissipating module are disposed on the casing, the busbar module is located below the IGBT power module, and the capacitor is located at a side of the IGBT power module and the busbar module, The heat-dissipating module further comprises a first flow deflecting channel and a second flow deflecting channel, the heat-dissipating module comprises a main water inlet pipe and a main water outlet pipe, each heat-dissipating fin comprises a first water channel and a second water channel separated from each other, the main water inlet pipe communicates with an inlet of each first water channel, the main water inlet pipe communicates with an inlet of each second water channel through the first flow deflecting channel, the main water outlet pipe communicates with an outlet of each first water channel, and the main water outlet pipe communicates with an outlet of each second water channel through the second flow deflecting channel.

2. The load controller according to claim 1, wherein the heat-dissipating module comprises a main water inlet pipe and a main water outlet pipe, each heat-dissipating fin comprises a cooling water channel inside, the main water inlet pipe communicates with an inlet of each cooling water channel, and the main water outlet pipe communicates with an outlet of each cooling water channel.

3. The load controller according to claim 1, wherein a flow direction of a heat exchange medium in the first water channel is opposite to a flow direction in the second water channel.

4. The load controller according to claim 1, further comprising a flow deflector, wherein both the first flow deflecting channel and the second flow deflecting channel are disposed in the flow deflector, and the flow deflector is disposed at a side of the outermost heat-dissipating fin among the multiple heat-dissipating fins.

5. The load controller according to claim 1, wherein the casing comprises an upper casing and a lower casing, the busbar module, the IGBT power module, and the heat-dissipating module are disposed on the lower casing, and the upper casing is detachably connected above the lower casing; wherein the casing further comprises an upper cover and a lower cover, the upper cover is detachably connected to the upper casing to close an upper open end of the upper casing, and the lower cover is detachably connected to the lower casing to close a lower open end of the lower casing.

6. The load controller according to claim 5, wherein the lower casing comprises a frame and an intermediate wall, the intermediate wall is connected to the frame to partition the frame into a first space and a second space, the first space is provided with the capacitor inside, and the second space is provided with the heat-dissipating module inside; and the second space of the frame is provided with a second bottom plate inside, the second bottom plate is provided with a boss, and the heat-dissipating module is supported on the boss.

7. The load controller according to claim 6, wherein the first space of the frame is provided with a first bottom plate inside, the first bottom plate comprises a first mounting through hole, and the capacitor is detachably connected to the first bottom plate and partially passes downward through the first mounting through hole.

8. The load controller according to claim 6, further comprising a fixing bracket, a driving circuit board, and a control circuit board, wherein the fixing bracket is fixed to the lower casing, the driving circuit board is electrically connected to each IGBT, the control circuit board is connected to the driving circuit board, the control circuit board is fixed to an upper surface of the fixing bracket, the driving circuit board is fixed to a lower surface of the fixing bracket, and the fixing bracket is located above the capacitor.

9. The load controller according to claim 1, wherein the DC busbar and the AC busbar are injection-molded into an integrated structure.

10. The load controller according to claim 9, wherein the DC busbar comprises a positive DC busbar and a negative DC busbar, and the AC busbar comprises a U-phase AC busbar, a V-phase AC busbar, and a W-phase AC busbar, wherein the U-phase AC busbar, the V-phase AC busbar, and the W-phase AC busbar are located in the same plane, and the positive DC busbar, the negative DC busbar, and the AC busbar are spaced apart from one another in an up-down direction.

11. The load controller according to claim 10, wherein the busbar module comprises a first insulating layer to a fourth insulating layer sequentially disposed in the up-down direction, one of the positive DC busbar, the negative DC busbar, and the AC busbar is disposed between the first insulating layer and the second insulating layer, one of the remaining two of the positive DC busbar, the negative DC busbar, and the AC busbar is disposed between the second insulating layer and the third insulating layer, and the other one of the remaining two of the positive DC busbar, the negative DC busbar, and the AC busbar is disposed between the third insulating layer and the fourth insulating layer.

12. The load controller according to claim 10, wherein the input end of each IGBT comprises an IGBT positive input terminal and an IGBT negative input terminal;

the positive DC busbar comprises a first positive terminal and multiple second positive terminals, the first positive terminal is connected to a positive output terminal of the capacitor, the multiple second positive terminals are connected to the multiple IGBT positive input terminals in one-to-one correspondence, a portion of the positive DC busbar forms the second positive terminal, one end of the second positive terminal is connected to the remaining portion of the positive DC busbar, and the other end of the second positive terminal is a free end; and the negative DC busbar comprises a first negative terminal and multiple second negative terminals, the first negative terminal is connected to a negative output terminal of the capacitor, the multiple second negative terminals are connected to the multiple IGBT negative input terminals in one-to-one correspondence, a portion of the negative DC busbar forms the second negative terminal, one end of the second negative terminal is connected to the remaining portion of the negative DC busbar, and the other end of the second negative terminal is a free end.

13. The load controller according to claim 12, wherein each column of IGBTs comprises at least one group of IGBTs, each group of IGBTs comprises three IGBTs, output terminals of the three IGBTs in the same group of IGBTs are a U-phase output terminal, a V-phase output terminal, and a W-phase output terminal, respectively; and Each of the U-phase output terminal, the V-phase output terminal, and the W-phase output terminal comprises a first output terminal and at least one second output terminal, the first output terminal is adapted to be connected to a corresponding phase input end of the load, the at least one second output terminal is connected to a corresponding phase output terminal in at least one column of IGBTs in one-to-one correspondence, a portion of each of the U-phase output terminal, the V-phase output terminal, and the W-phase output terminal forms the second output terminal, one end of the second negative terminal is connected to the remaining portion of the corresponding phase AC busbar, and the other end of the second negative terminal is a free end.

14. The load controller according to claim 1, further comprising a connector, wherein the connector is disposed on the casing, and the connector comprises a connector positive output terminal and a connector negative output terminal, the connector positive output terminal is connected to a positive input terminal of the capacitor through a threaded connecting member, and the connector negative output terminal is connected to a negative input terminal of the capacitor through a threaded connecting member.

15. The load controller according to claim 1, further comprising a pressing device, wherein the pressing device is elastically clamped between the casing and the heat-dissipating module to adjust the magnitude of a clamping force of adjacent two heat-dissipating fins on the IGBT between the adjacent two heat-dissipating fins.

16. The load controller according to claim 15, wherein the pressing device comprises an elastic component and an adjusting component, the elastic component is clamped between the adjusting component and the heat-dissipating module, and the adjusting component is adapted to adjust the magnitude of an elastic force applied by the elastic component to the heat-dissipating module.

17. The load controller according to claim 16, wherein the elastic component comprises an elastic member, a first fixing plate, and a second fixing plate, the first and second fixing plates are disposed oppositely, the elastic member is clamped between the first fixing plate and the second fixing plate, the first fixing plate is in contact with the heat-dissipating module, and the adjusting component is configured to adjust a distance between the second fixing plate and the first fixing plate; and the elastic member is a corrugated elastic sheet.

18. The load controller according to claim 17, wherein the adjusting component comprises a stud and a nut, the stud comprises a left-handed threaded section and a right-handed threaded section, the second fixing plate is provided with a left-handed threaded hole fitting the left-handed threaded section, the nut is fixed to the casing, and the nut fits the right-handed threaded section, wherein the second fixing plate comprises a fixing plate body and a fixing block, the fixing block is fixed to the fixing plate body, and the fixing block comprises the left-hand threaded hole.

19. An electric vehicle, comprising:
    a power battery pack;
    a load, the load comprising a motor; and
    the load controller according to claim 1, the AC busbar of the load controller is connected to the load, and a capacitor of the load controller is connected to the power battery pack.

* * * * *